US006916748B2

(12) United States Patent
Huang

(10) Patent No.: US 6,916,748 B2
(45) Date of Patent: Jul. 12, 2005

(54) METHOD OF FORMING EMITTER TIPS ON A FIELD EMISSION DISPLAY

(75) Inventor: Yung-Meng Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 219 days.

(21) Appl. No.: 10/302,488

(22) Filed: Nov. 22, 2002

(65) Prior Publication Data

US 2003/0124869 A1 Jul. 3, 2003

(30) Foreign Application Priority Data

Dec. 31, 2001 (TW) ....................................... 90133415 A

(51) Int. Cl.[7] .............................................. H01L 21/302

(52) U.S. Cl. ....................... 438/710; 438/712; 438/714; 438/720; 438/725

(58) Field of Search ................................. 438/710, 712, 438/714, 720, 725

(56) References Cited

U.S. PATENT DOCUMENTS 5,219,485 A * 6/1993 Wang et al. ............... 252/79.3
5,647,785 A * 7/1997 Jones et al. .................... 445/24
6,066,507 A * 5/2000 Rolfson et al. ............... 438/20
6,095,882 A * 8/2000 Wells et al. .................. 445/24
6,648,710 B2 * 11/2003 Milligan et al. .............. 445/50

* cited by examiner

*Primary Examiner*—Nadine G. Norton
*Assistant Examiner*—Binh X. Tran
(74) *Attorney, Agent, or Firm*—Quintero Law Office

(57) ABSTRACT

A method of forming emitter tips on a field emission display. A conductive layer is formed on a substrate, and then a photoresist layer is formed on the conductive layer wherein the photoresist layer has at least a pattern for defining predetermined areas of the emitter tips. Next, using plasma etching with the pattern of the photoresist layer as a mask, the conductive layer is etched to become a plurality of emitter stages. The etching rate of the conductive layer is greater than the etching rate of the photoresist layer. Finally, continuous use of plasma etching with an increased vertical-etching rate etches the lateral sidewalls of the emitter stages, thus shaping them as emitter tips.

8 Claims, 2 Drawing Sheets

METHOD OF FORMING EMITTER TIPS ON A FIELD EMISSION DISPLAY

BACKGROUND OF THE INVENTION

1. Field of the Invention

The present invention relates to a field emission display and, more particularly, to a method of forming emitter tips on the field emission display.

2. Description of the Related Art

The manufacture and use of field emission displays is well known in the art. The resolution of a field emission display is a function of a number of factors, including emitter tip sharpness.

One current approach toward the creation of an array of emitter tips is to use a mask to form the emitter tip structure, in which the mask is stripped from the apex of the emitter tip structure prior to etching the tip to sharpness. It is necessary to terminate the etch when or before the mask is fully undercut to prevent the mask from being dislodged from the apex. However, under such circumstances, the tips become lopsided and uneven due to the presence of the mask material along the side of the tip during a dry etch. Also, this may degrade the apex of the emitter tip structure. Moreover, this dislodged mask results in randomly placed and undesired structures. Furthermore, if the etch is continued after the mask is removed, the tips become more dull because the etch chemicals remove material in all directions to attack the exposed apex the tip. In addition, the apex of the tip may be degraded when the mask has been dislodged due to physical ion bombardment during a dry etch.

Accordingly, one solution is to stop the etching process before a fine point is formed at the apex of the tip. An oxidation step is then performed to sharpen the tip. However, since this creates a non-uniform etching across the array, the tips then have different heights and shapes.

In the manufacture of emitter tips, the tips should be of uniform height, aspect ratio, sharpness, and general shape with minimal deviation, particularly in the uppermost portion. In one approach used to overcome the illustrated problems, a mask is formed over the substrate before etching begins wherein the mask has a composition and dimensions that enable it to remain balanced on the apex of the tips until all the tips are substantially formed as the same shape. Nevertheless, the uniformity of the mask cannot always be guaranteed and slipping of the mask onto the substrate still occurs, thus there are still problems with the balancing of the mask on the apex of the tips.

SUMMARY OF THE INVENTION

The present invention provides a method of forming emitter tips on a field emission display, in which plasma etching is employed to solve the above-mentioned problems.

In the method of forming emitter tips on a field emission display, a conductive layer is formed on a substrate and then a photoresist layer is formed on the conductive layer. The photoresist layer has at least a pattern for defining predetermined areas of the emitter tips. Next, using plasma etching with the pattern of the photoresist layer as a mask, the conductive layer is anisotropically etched to become a plurality of emitter stages. The etching rate of the conductive layer is greater than the etching rate of the photoresist layer. Finally, continuous plasma etching with an increased vertical-etching rate etches the lateral sidewalls of the emitter stages, shaping them as emitter tips.

Accordingly, it is a principal object of the invention to provide emitter tips of uniform height, aspect ratio and sharpness.

It is another object of the invention to provide emitter tips with an apex angle of approximately 118°.

Yet another object of the invention is to provide emitter tips on a field emission display without long electron trajectory.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE INVENTION

As is known in semiconductor processing, when the metallization process uses plasma etching to pattern metal lines, the edge of the metal line is always damaged if a photoresist layer covering the metal line has an insufficient thickness. Accordingly, the present invention uses plasma etching to pattern a conductive layer covered by a mask with a predetermined thickness, thus the lateral sidewall of the conductive layer is damaged till a sharp tip is formed.

Figure 1:
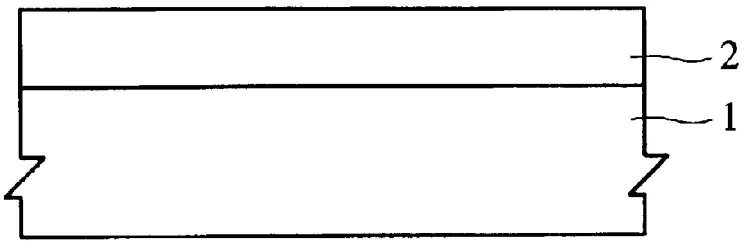
FIGS. 1 to 5 are sectional diagrams showing a method of forming emitter tips according to the present invention.

FIGS. 1 to 5 are sectional diagrams showing a method of forming emitter tips according to the present invention. First, as shown in FIG. 1, a silicon substrate 1 is provided followed by deposition of a conductive layer 2 thereon. Preferably, the conductive layer 2 of 6000 Å thickness is tungsten (W) with a lower work function. Thus, using tungsten to form the emitter tips increases the emitting current to contribute a higher resolution and a higher brightness to the field emission display.

Figure 2:
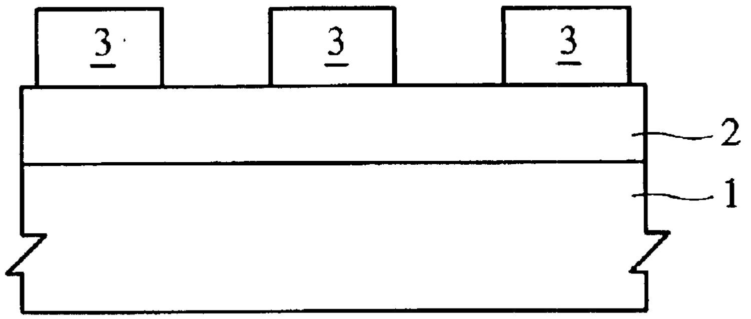

Then, as shown in FIG. 2, using photolithography and etching, a photoresist layer 3 is patterned on the conductive layer 2, in which the photoresist layer 3 of 8000 Å thickness has a pattern for defining areas of predetermined emitter tips. Preferably, plasma etching with $SF_6$ as the main reactive gas is employed to form the pattern of the photoresist layer 3. Also, the reactive gases may be selected from a group consisting of Cl, F, C. and $C_3F_8$. In another case, F and $O_2$ are employed. The material used to form the photoresist layer 3 is not limited beyond sufficient thickness and an appropriate characteristic to prevent the photoresist layer 3 being completely removed from the plasma etching.

Figure 3:
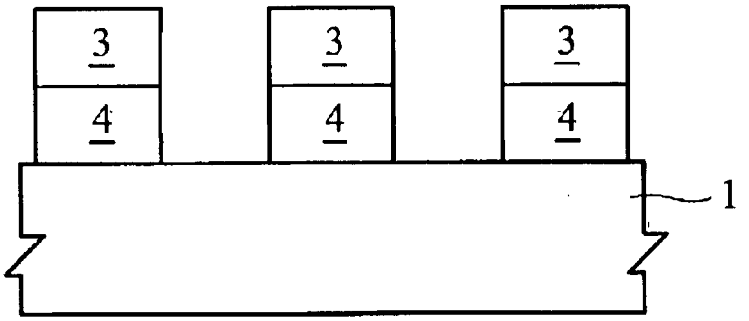

Next, as shown in FIG. 3, using a plasma etching with the pattern of the photoresist layer 3 as a mask, the conductive layer 2 is etched to become a plurality of emitter stages 4.

Figure 4:
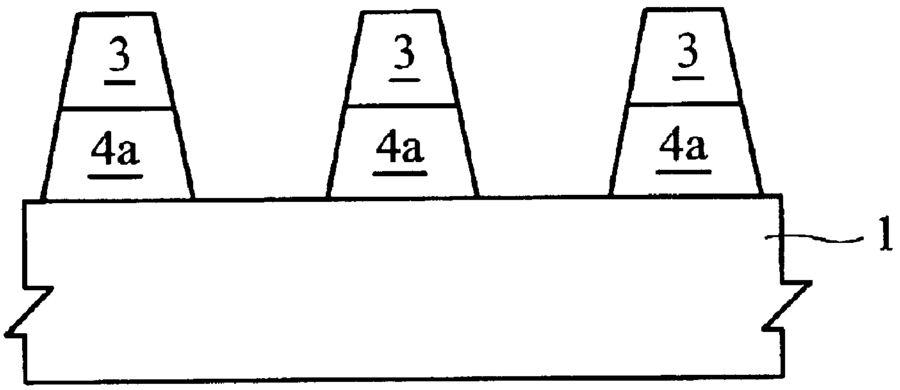

Thereafter, as shown in FIG. 4, continuously using the above-described plasma etching with an increased process pressure to provide a higher vertical-etching rate, the emitter stages 4 are continuously etched to become trapezoid-shaped stages **4*a*. Preferably, in this step of plasma etching, the amount of Ar or $O_2$ is increased to increase the process pressure, and the etching rate of the conductive layer is greater than the etching rate of the photoresist layer 3. Preferably, this step of plasma etching has an etching selectivity of the conductive layer 2 to the photoresist layer 3** is 2:1.

Figure 5:
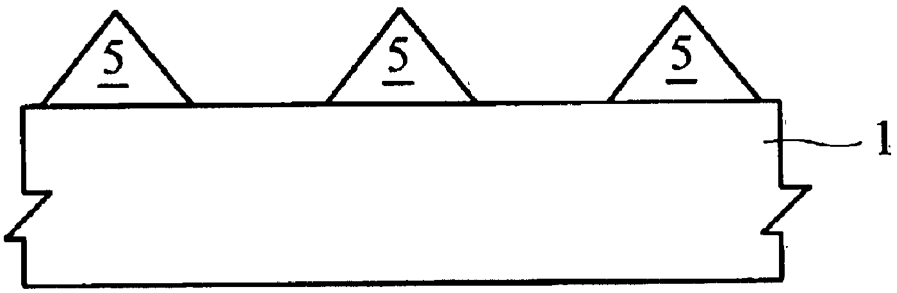

Finally, as shown in FIG. 5, continuously using the above-described plasma etching, the trapezoid-shaped stages 4*a* are etched to form emitter tips 5 with a uniform triangle-shaped profile and appropriate size, respectively. Preferably, the emitter tip 5 has a 2500~3000 Å height, and the apex angle of the triangle-shaped profile is approximately 118°. Then, any well-known striping process may be employed to remove the remaining of the photoresist layer 3.

In the above-mentioned plasma etching to etch the conductive layer 2, the reactive gas is a fluorine-containing gas, such as $SF_6$. Fluorine-containing gases in plasma (such as $NF_3$ and $CF_4$), chlorine-containing gases (such as HCl, $Cl_2$) and adsorptive helium (He) may be added into the reactive gas source.

Furthermore, as the performances of Van der Waals' force, electrical chemistry, static electricity and surface interaction vary with different materials, the profile and size of the emitter tip are closely related to the material of the conductive layer 2. The present invention uses tungsten to form the conductive layer 2 to achieve the preferred profile and size.

In addition, since the above-described method of forming the emitter tips 5 is a chemical process driven by plasma energy, the desired profile and accurate size of the emitter tip 5 is a function of a number of etching-control factors, including surface temperature, dipping time, etching gas recipe, pressure, RF power source and functions of the etching apparatus.

It is to be understood that the present invention is not limited to the embodiments described above, but encompasses any and all embodiments within the scope of the following claims.

What is claimed is:

1. A method of forming emitter tips on a field emission display, comprising steps of:

forming a conductive layer on a substrate;

forming a photoresist layer on the conductive layer, in which the photoresist layer has at least a pattern for defining predetermined areas of the emitter tips;

performing a predetermined etching process with the pattern of the photoresist layer as a mask to etch the conductive layer anisotropically as a plurality of emitter stages, in which the etching rate of the conductive layer is greater than the etching rate of the photoresist layer; and continuously performing the predetermined etching process with an increased vertical-etching rate to etch the lateral sidewalls of the emitter stages to form the emitter tips.

2. The method of forming emitter tips on a field emission display according to claim 1, wherein the predetermined etching process is a plasma etching process.

3. The method of forming emitter tips on a field emission display according to claim 2, wherein the increased vertical-etching rate is provided by increasing the pressure of the plasma etching process.

4. The method of forming emitter tips on a field emission display according to claim 3, wherein Ar or $O_2$ are added to increase the pressure of the plasma etching process.

5. The method of forming emitter tips on a field emission display according to claim 2, wherein the conductive layer is tungsten.

6. The method of forming emitter tips on a field emission display according to claim 1, wherein in the predetermined etching process, etching selectivity of the conductive layer to the photoresist layer is 2:1.

7. The method of forming emitter tips on a field emission display according to claim 6, wherein the thickness of the conductive layer is 2500 Å~3000 Å and the thickness of the photoresist layer is 6000 Å~8000 Å.

8. The method of forming emitter tips on a field emission display according to claim 1, wherein in the predetermined etching process uses $SF_6$ as the reactive gas.

* * * * *